United States Patent [19]

Long et al.

[11] 4,200,351
[45] Apr. 29, 1980

[54] STRAIGHT THROUGH ELECTRICAL SPRING PROBE

[75] Inventors: Everett J. Long, Claremont; Elmer W. Muench, Covina, both of Calif.

[73] Assignee: Everett/Charles, Inc., Pomona, Calif.

[21] Appl. No.: 914,393

[22] Filed: Jun. 12, 1978

[51] Int. Cl.² ............................................. H01R 13/16
[52] U.S. Cl. ........................... 339/108 TP; 339/255 R
[58] Field of Search ............. 339/17 C, 17 LC, 17 M, 339/48, 49 B, 75 M, 75 MP, 108 TP, 217 R, 217 S, 252 S, 253 R, 253 S, 255 R, 126, 188; 324/158 F, 158 P

[56] References Cited

U.S. PATENT DOCUMENTS

| | | | |
|---|---|---|---|
| 1,392,558 | 10/1921 | Darrah et al. | 339/48 |
| 1,482,833 | 2/1924 | Averill | 339/48 |
| 1,567,474 | 12/1925 | Tomlinson | 339/48 |
| 2,292,236 | 8/1942 | Martin | 339/108 TP |

FOREIGN PATENT DOCUMENTS 458369 7/1950 Italy ....................................... 339/253 S Primary Examiner—Joseph H. McGlynn
Attorney, Agent, or Firm—Christie, Parker & Hale

[57] ABSTRACT

A straight through electrical spring probe has an elongated resilient thin wall tubular member slit along the entire length thereof and comprises, in the wall, a transversely enlarged portion and a transversely inwardly extending stop. An elongated plunger member is telescoped in the tubular member and comprises a probe head exposed at one end, a connector portion exposed at the other end of the tubular member and a stop therebetween. A compression spring urges the telescoped plunger member and tubular member in opposite directions until the stops in the tubular member and plunger member are in engagement.

26 Claims, 9 Drawing Figures

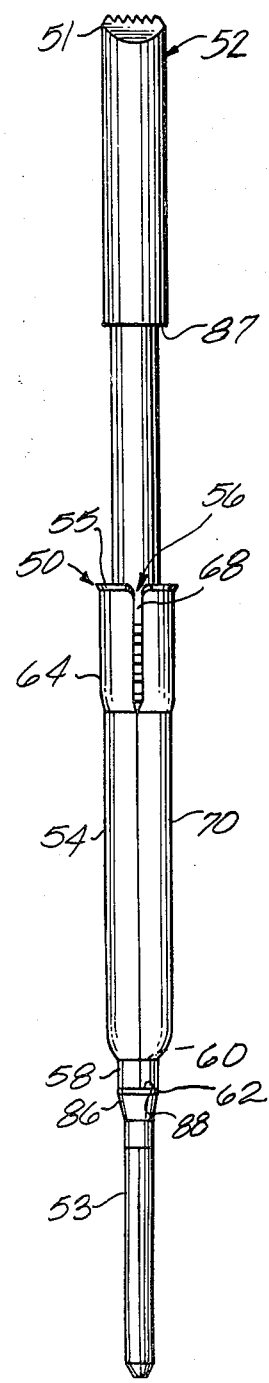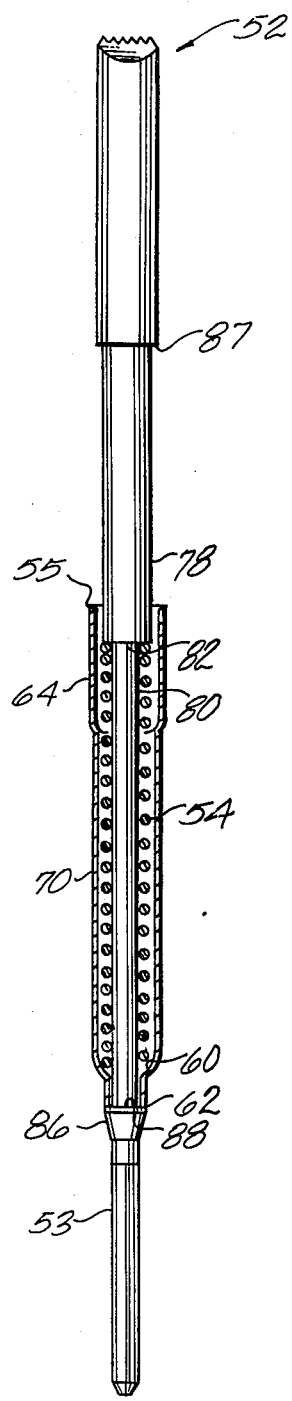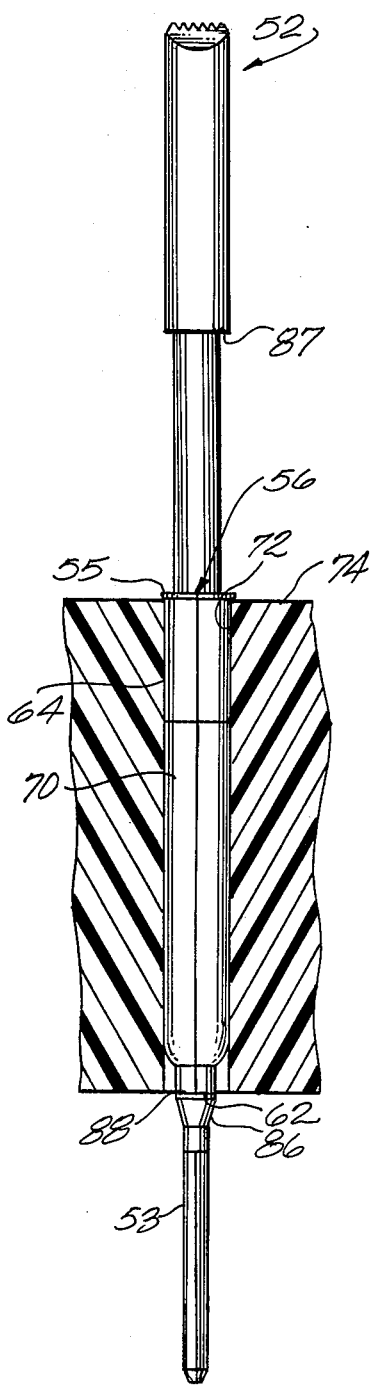

STRAIGHT THROUGH ELECTRICAL SPRING PROBE

BACKGROUND OF THE INVENTION

This invention relates to miniature telescoping spring loaded electrical probes (hereinafter telescoping spring probes) for establishing low resistance eclectrical test connections with conductors on, for example, printed circuit boards.

Telescoping spring probes are generally known for making electrical test connections with conductors on printed circuit boards. They are generally affixed in a jig employed in a circuit tester, and continuity, lack of continuity or other electrical characteristics between the various electrical nodes on a printed circuit board are detected through the probes.

Modern circuit testers generally require telescoping spring probes for making electrical contact through each probe to a different one of a number of very closely spaced nodes. Typically it is necessary in each jig to make electrical contact with, for example, hundreds of nodes, any one of which may be spaced as closely as 0.100 inch on center. As a result, a need has arisen for spring probes with an outside housing diameter (O.D) in the order of 0.04 to 0.150 inch. The problem is made more complex by the requirement that consistent low electrical resistance be maintained through the telescoping spring probe.

Because of the extremely large number of telescoping spring probes required for each jig and circuit tester, the total cost for the telescoping spring probes may be quite substantial and even a minor increase in cost for each probe results in a very substantial increase in total cost for the overall circuit tester.

One type of telescoping spring probe is known and is commonly referred to as the snap out spring probe. In this device there is a receptacle and an interchangeable spring probe which is inserted into the receptacle. The receptacle in turn is inserted through a nonconductive mounting member so that the bottom end of the receptacle is exposed for crimping, wirewrapping, soldering, etc., to a conductor. The spring probe includes an elongated electrically conductive tubular housing and an elongated electrically conductive plunger telescoped in the tubular housing. The plunger has a probe head exposed at one end of the tubular housing. A spiral compression spring mounted inside of the tubular housing urges the plunger and housing to a fully extended stop. Electrical connection is made from the probe head to the bottom end of the receptacle via the connection between the plunger and the inside wall of the housing and through the housing to the inside wall of the receptacle.

It has been found that the electrical resistance between the plunger and housing varies with prolonged cycling, due to wear of the parts, wear particle buildup between parts, movement between parts, and changes in pressure of the coil compression spring during a telescoping cycle. As a result, attempts have been made to reduce the resistance between the plunger and tubular housing by the introduction of small metal balls between the plunger and wall of the tubular housing and by the addition of separate wiper springs between the plunger and housing. However, these special parts result in added cost not only in parts but in labor.

Electrical connectors are known which eliminate the need for connection through the housing and receptacle. For example, a connection may be made directly to the tubular housing itself, eliminating the receptacle. By way of additional example, U.S. Pat. No. 3,437,984 discloses an electrical spring probe having a conductive plunger with an internal end in a housing and an external probe end. The internal end engages a conductive spiral compression spring. The spiral compression spring serves to urge the plunger to a fully extended position and its opposite end is externally exposed for connection to a conductor. Electrical connection is formed through the plunger and the spring.

Another prior art device involves a straight through probe having an elongated tubular housing and an elongated conductive plunger which extends completely through the housing. The plunger has its opposite ends exposed, one end comprising a probe head and the opposite end comprising a connector to which a conductor may be wirewrapped, crimped, soldered, or otherwise connected. A spiral compression spring urges the plunger and housing to a fully extended stop condition.

In all of the aforementioned telescoping spring probes the tubular housing is generally formed from a solid tube and generally a stop in the form of a detent or enlargement is formed on the plunger. Since it is necessary for the spiral compression spring to preload the plunger, it is necessary to retain the preloaded plunger while forming a stop in the tubular member to limit travel of the plunger relative to the housing. In this regard the stop may be formed in the housing by forming a detent or rolling an inwardly extended ring around the perimeter of the housing.

These steps add substantially to the cost of manufacturing a telescoping spring probe.

SUMMARY OF THE INVENTION

Briefly, an embodiment of the present invention comprises a straight through electrical spring probe. Included is an elongated resilient thin wall tubular member having a longitudinal passage therethrough. The tubular member has a resilient and expandable first wall portion forming first and second oppositely facing stops. Longitudinally spaced from the first wall portion is a transversely retractable resilient second wall portion of larger outer perimeter than an adjacent portion of the wall. Also included is an elongated electrically conductive plunger member forming at one end a probe head and adjacent the opposite end a connection portion. The plunger member forms third and fourth substantially facing stops. The plunger member is insertable through the passage until the plunger and tubular member are in a telescoped condition wherein the probe head and connector portions are exposed at opposite ends of the tubular member. In the telescoped condition the first and third stops are in substantially opposed relation and the second and fourth stops are in substantially opposed relation. During the insertion the fourth stop forces the first wall portion of the tubular member and the first and second stops to expand and, due to the resiliency thereof, retract to the opposed relation with the corresponding third and fourth stops. A spiral compression spring is positioned around the plunger member and in the passage and has opposite ends for engagement with the first and third opposed stops so as to urge the plunger member and tubular member in opposite directions until the second and fourth stops are in engagement.

With such an arrangement it is now possible to fabricate the tubular member forming a housing from a thin flat stock. Additionally the tubular member is merely a carrier for the plunger and its electrical characteristics are of little importance because there is no need to make electrical connection with the plunger member and hence the tubular member may be fabricated from an inexpensive corrosion resistant material at very low cost.

Also, assembly of the plunger member and the tubular member is substantially simplified with respect to the prior art electrical spring probes. In this regard it is only necessary to insert the plunger through the passage in the tubular member as the stop in the tubular member is preformed. Thus the additional steps of retaining the preloaded plunger and forming a stop in the tubular member or housing are not required.

Significantly the transversely retractable resilient second wall portion, being of larger outer perimeter than the adjacent portion of the wall, allows the tubular member to be inserted into an opening in a mounting member. The opening in the mounting member is of smaller outer perimeter than the second wall portion and as a result forces the second wall portion to retract. Due to its resiliency the second wall portion tends to expand, thereby retaining the tubular member in the opening.

The cost of fabricating the tubular member is about 1/10th that of the prior art tubular housing and the overall cost of fabricating a straight through electrical spring probe in accordance with the present invention is estimated to be about ½ the cost of the aforementioned prior art spring probes.

Preferably the housing of the tubular member is formed from a thin wall tubing and a slit is provided along the length thereof, allowing the first wall portion to expand. Preferably the slit forms a separation at the second wall portion, allowing the second wall portion to be retracted inwardly when the tubular member is inserted in the mounting member.

Preferably the wall of the tubular member and the slit are longitudinally tapered along at least a portion thereof which comprises the second wall portion.

An alternate embodiment of the invention has a ring shaped enlargement formed at the second wall portion.

DESCRIPTION OF THE DRAWINGS

FIG. 1 also illustrates the steps of a method embodying the present invention;

FIG. 5 is a side elevation view of an alternate straight through electrical spring probe in accordance with the present invention;

FIG. 6 depicts the straight through electrical spring probe of FIG. 5 with the tubular member and spiral compression spring partially broken away;

FIG. 7 depicts the straight through electrical spring probe of FIG. 5 inserted through a mounting member;

DETAILED DESCRIPTION

Refer now to the straight through electrical spring probe of FIGS. 1-4. The straight through electrical spring probe includes an elongated resilient thin wall tubular member 10, an elongated electrically conductive plunger member 12, and a spiral compression spring 14. When assembled, the plunger member 12 and the tubular member 10 telescope and the spiral compression spring 14 biases the plunger member upward relative to the tubular member as seen in FIGS. 1-4. The thus assembled straight through electrical spring probe is then positioned through a support member such as that depicted at 16.

Figure 4:
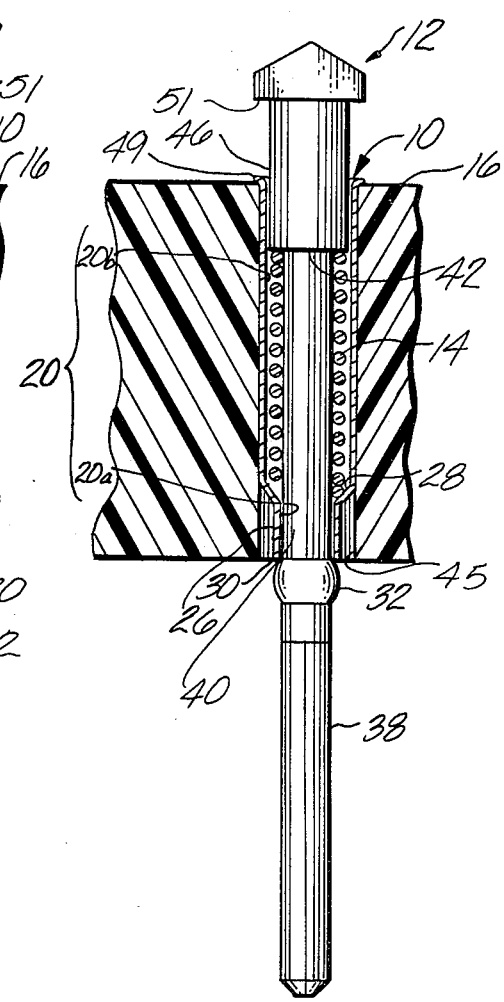
FIG. 4 is similar to FIG. 3 with a portion of the housing and the spiral compression spring broken away to reveal the interior portions of the straight through spring probe after it has been inserted in the mounting member.

Consider the construction of the tubular member. Significantly, the tubular member has a longitudinal passage 18 extending therethrough. In the passage 18 the inside wall of the tubular member 10 forms a linear bearing 20 for the plunger member 12 (FIG. 4).

The tubular member 10 is tapered and along the entire length has a slit 22. The slit 22 is but a separation at the upper portion. As a result, the tubular member 10 forms a transversely retractable resilient wall portion 24 which is of larger diameter than the wall portion therebelow. This construction allows the tubular member to be inserted in and, because of the tendency of the retractable resilient wall portion 24 to widen transversely, retain itself in an opening in the support member 16. The diameter of the tubular member at 21 is substantially equal to the diameter of the opening in the support member 16, and the separation of the slit 22 is sufficient to allow the enlarged wall portion 24 to be retracted to the diameter of the opening in the support member in which it is positioned.

Figure 2:
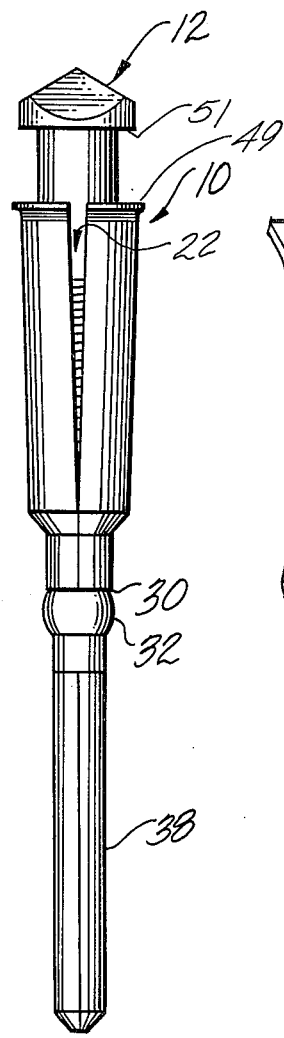
FIG. 2 is a side elevation view of the electrical spring probe of FIG. 1 in the assembled condition.
Figure 3:
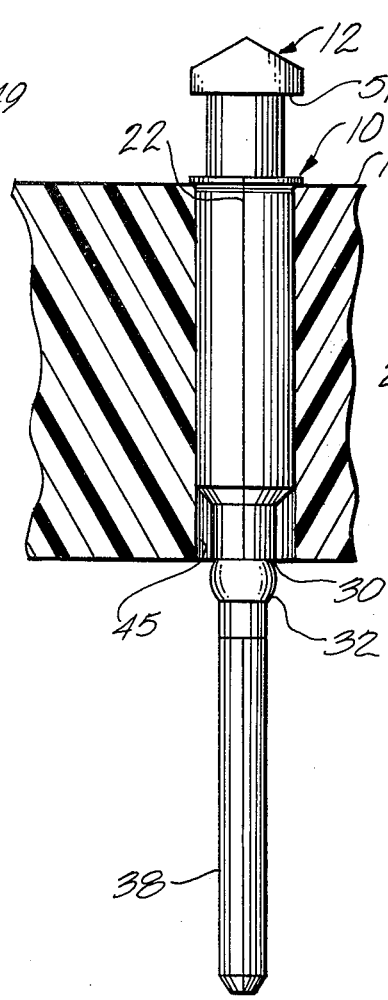
FIG. 3 is a cross-sectional view of a mounting member with a straight through electrical spring probe of the type depicted in FIG. 1 inserted therethrough.

Additionally the tubular member 10 includes an inwardly extending ring shaped portion 26. The ring shaped wall portion 26 forms, at its opposite ends, stops 28 and 30. To be explained in more detail, stop 28 is for engagement with one end of the spiral compression spring 14, whereas the stop 30 engages a stop 32 in the plunger member 12 to limit upward travel of the plunger as seen in FIGS. 2-4 under the urging of the spiral compression spring 14.

Significantly the slit 22 in the tubular member in the area of the ring shaped wall portion 26 allows the latter to expand transversely around the larger stop 32 as the plunger 12 is inserted into the top of tubular member 10 as seen in FIGS. 1-4. Also, resiliency of the ring shaped wall portion 26 causes it to retract back around the smaller perimeter of the plunger member, contributing to the low cost and simplicity of construction.

Consider now the plunger member 12. The plunger member 12 has a probe head 36 at one end and, adjacent the opposite end, a connector portion 38. The connector portion 38 may be of different shapes and configurations within the scope of the present invention but is square in cross-section in the embodiment of FIG. 1. The connector portion 38 is external to the tubular member 10 after the plunger member has been inserted and is exposed so that it can be wirewrapped, soldered, or otherwise connected to connecting wires.

The plunger member 12 has a smaller diameter cylindrical portion 40 which extends inwardly relative to the adjacent portions of the plunger member 12, thereby forming the stop 32 and another stop 42. The stop 42 is provided for engagement of the opposite end of the spiral compression spring 14 from that engaging the stop 28 in the tubular member.

Also formed from plunger member 12 between the probe head and the connector portion is a linear bearing 44. The linear bearing 44 includes the smaller diameter cylindrical portion 40 and an enlarged cylindrical portion 46 at the opposite side of the stop 42. The linear bearing 20 includes the inner surface 20a of the necked down ring shaped wall portion 26 and the inner surface 20b of the larger portion of the tubular member 10. (FIG. 4). The tubular member is preferably dimensioned in cooperation with the dimension of the separation in the slit 22 and the diameter of the receiving opening in the support member so that when the tubular member is inserted in the opening in the support member, the wall portion 24 is forced to retract until the spacing in the slit is closed as seen in FIG. 3. At this point the diameter of the inner surface 20b is in the order of 0.001 to 0.007 inch larger than the diameter of the larger diameter cylindrical bearing portion 46, and the diameter of the surface 20a is in the order of 0.001 to 0.006 inch larger than the outer diameter of the smaller diameter cylindrical portion 40 as generally illustrated in FIG. 4. As a result these surfaces form a low friction linear bearing.

The tubular member 10 includes a further stop 49 at the upper end and a corresponding stop 47 is formed on the lower transverse surface of the probe head 36. The stops 49 and 47 limit the downward travel of the plunger member relative to the tubular member, whereas stops 30 and 32 limit the upward travel of the plunger member relative to the tubular member as seen in FIGS. 1-4.

Figure 1:
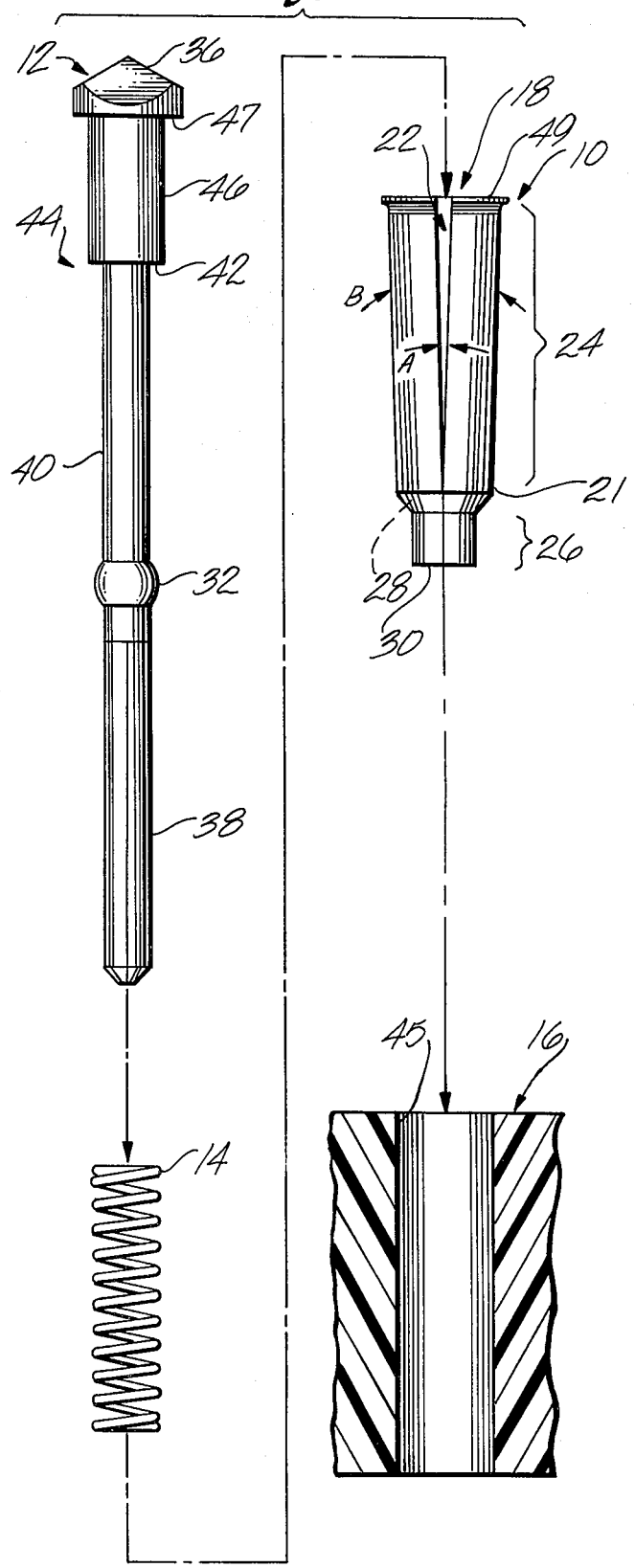
FIG. 1 is an exploded view of a straight through electrical spring probe and embodying the present invention; also included is a cross-sectional view of a mounting member having an opening into which the straight through electrical spring probe is inserted.

Preferably the plunger members are formed of a gold plated berryllium copper alloy whereas the tubular members are formed from a thin nickel plated brass sheet of material in the order of 0.005 inches thickness. Preferably the diverging angle "A" of the slit 22 is in the order of 3° and the diverging angle "B" of the sides of the tubular member as seen in FIGS. 1 and 2 is in the order of 3°. Preferably the diameter of the tubular member is in the order of 1/16th of an inch, and the overall length of the tubular member is in the order of ¼ of an inch.

Consider now the method or steps or making a straight through electrical spring probe as illustrated in FIG. 1:

First, an elongated resilient thin wall tubular member such as that depicted at 10 and as described hereinabove, is formed. Also, an elongated electrically conductive plunger member as described above is formed. Further, a spiral compression spring such as that depicted at 14 is formed.

Second, the spiral compression spring 14 is slid over the cylindrical portion 40 of the plunger member 12.

Third, the plunger member 12 is inserted through the passage 18 of the tubular member until the tubular member and plunger member are in a telescoped condition.

In the telescoped condition the probe head and connector portions are exposed at opposite ends of the tubular member and the stops 30 and 32 are in opposed relation and the stops 28 and 42 are also in opposed relation, with the spiral compression spring extending between the stops 28 and 42.

During assembly, the bottom end of the plunger member is inserted first into the top of the tubular member (as seen in FIG. 1) and as a result the stop 32, being of larger outer perimeter than the passage at the inwardly extending ring shaped wall portion 26, forces the ring shaped wall portion 26 to expand transversely. In this regard it will be noted that the lower side of stop 32 is curved or diverges upwardly and the walls of the stop 28 also diverge upwardly. As a result the stop 32 slides along the passage 18, making the transition into the inwardly extending ring shaped wall portion 26 with relative ease. After the inwardly extending ring shaped wall portion 26 is above the stop 32 as seen in FIG. 1, resiliency of the wall causes it to retract around the smaller diameter cylindrical portion 40 of the plunger member, thereby providing the linear bearing discussed above.

FIG. 2 depicts the straight through electrical spring probe after the assembly. The thus assembled straight through electrical spring probe is then inserted through an opening 45 in the support member 16, causing the wall portion 24 of the tubular member to retract until the separation in the slit 22 is substantially closed as depicted in FIG. 3. The straight through electrical spring probe assembled in the support member 16 is depicted in FIGS. 3 and 4.

Refer now to the straight through electrical spring probe depicted in FIGS. 5-7. The straight through electrical spring probe of FIGS. 5-7 includes an elongated resilient thin wall tubular member 50, an elongated electrically conductive plunger member 52, and a spiral compression spring 54. The tubular member 50 is generally similar in construction to the tubular member 10 in that it is generally circular in cross-section and has a slit 56 along the entire length thereof. Additionally it has an inwardly extending ring shaped wall portion 58 forming a stop 60 for the spiral compression spring 54, and a stop 62 for the plunger member 52.

However, in contrast to the tubular member 10, the tubular member 50 does not have a tapered outer wall but instead has a ring shaped enlarged portion 64 at the opposite end from the inwardly extending ring shaped wall portion 58. The slit 56 in the enlarged ring shaped portion 64 forms a separation 68. As a result the enlarged ring shaped portion forms a transversely retractable resilient wall portion for securing the tubular member in an opening through a support member. The portion 70 of the tubular member which is below the enlarged ring shaped portion 64 but above the ring shaped wall portion 58, and the opening 72 in the mounting member 74, are selected so that they are of substantially the same diameter. The enlarged ring shaped portion 64 is selected so that it is of slightly larger diameter than the opening 72 in the mounting member. Upon insertion of the tubular member 50 into the opening 72, the enlarged portion 64 is forced to retract and, due to its resiliency, retains the tubular member within the opening of the mounting member.

The plunger member 52 also includes a larger diameter cylindrical portion 78 and an inwardly extended or smaller diameter cylindrical portion 80 similar to the cylindrical portions 46 and 40 of plunger member 12, thereby forming a stop 82 for the upper end of the spiral compression spring 54. The outer diameter of the larger diameter cylindrical portion 78 and the dimensions of the enlarged ring shaped portion 64 of the tubular member are selected so that after insertion in the opening 72, and the spacing 68 in the slit 56 is closed, the passage of the enlarged ring shaped wall portion 64 forms a linear bearing for the enlarged cylindrical portion 78 similar to that discussed above relative to the tubular member 10.

The plunger member 52 also includes a stop 86 corresponding to the stop 32 of the plunger member 12. The lower wall of the stop 86 similar to the stop 32 is tapered, whereas the upper side 88 forms a flat transverse surface 88 for engagement with the stop 62. The lower transverse surface 87 of a probe head of the plunger member 52 and the upper end 55 of the tubular member 50 form a stop which limits the downward travel of the plunger member relative to the tubular member.

Figure 8:
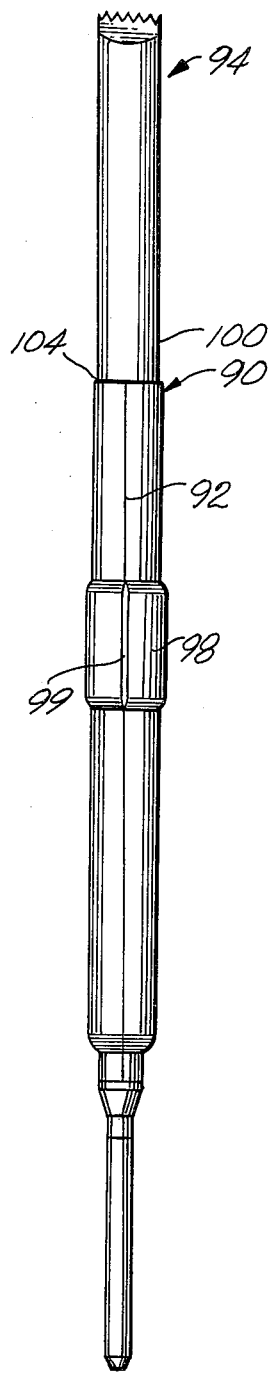
FIG. 8 is a side elevation view of still another straight through electrical spring probe and embodying the present invention.
Figure 9:
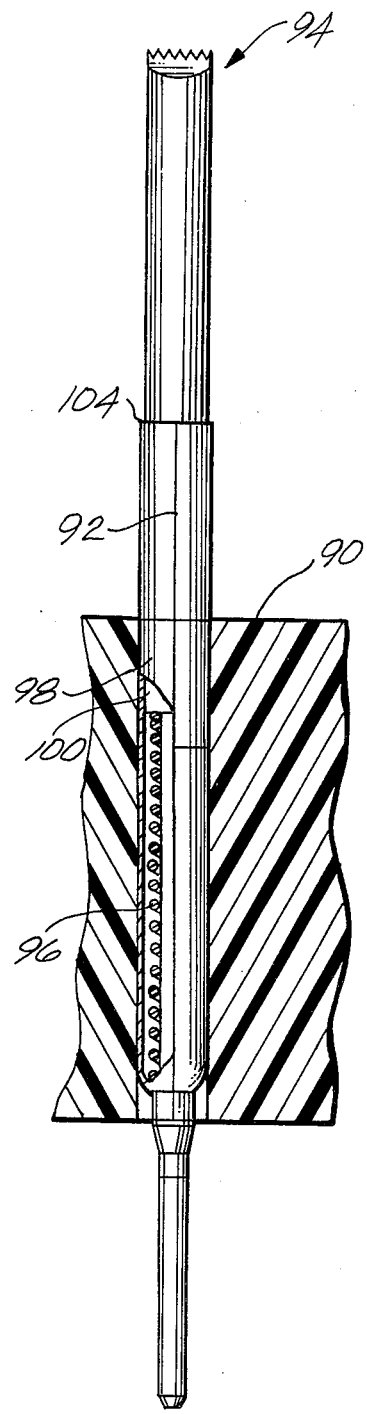
FIG. 9 depicts the straight through electrical spring probe of FIG. 8 after it has been inserted in a mounting member; a portion of the tubular member and spiral compression spring have been broken away.

The straight through electrical spring probe of FIGS. 8 and 9 is similar to that of FIGS. 5-7 and includes a thin wall tubular member 90 having a slit 92 along the entire length of the wall, an elongated electrically conductive plunger member 94 and a spiral compression spring 96. The tubular member 90 is constructed similar to the tubular member 50 in that it includes an enlarged ring shaped portion 98 having a slit portion 99 which forms a separation. However, in contrast to the tubular member 50, the enlarged ring shaped portion 98 is spaced downward from the upper end of the tubular member between the upper and lower ends. Additionally the passage in the tubular member 90 on each side of the enlarged ring shaped portion 98 forms a linear bearing for the larger cylindrical portion 100.

The plunger member 94 is also similar to the plunger member 52.

The upper ends of the tubular members 10 and 50 are flared to form stops. In contrast, the upper end 104 of tubular member 90 is not flared.

Preferably the enlarged ring shaped portions 64 and 98 in the tubular members 50 and 90 extend beyond the outer diameter of the adjacent portions of the tubular member by about 0.004 inches.

Although an exemplary embodiment of the invention has been disclosed for purposes of illustration it will be understood that various changes, modifications and substitutions may be incorporated into such embodiment without departing from the spirit of the invention as defined by the claims appearing hereinafter.

What is claimed is:

1. A straight through electrical spring probe comprising:
    an elongated resilient thin wall tubular member comprising a passage and a slit along the entire length thereof, a transversely enlarged wall portion and a wall portion transversely inwardly extending, relative to the enlarged portion, into the passage, thereby forming a stop;
    an elongated plunger member telescoped in the passage of the tubular member and comprising a probe head exposed at one end, a connector portion exposed at the other end of the tubular member and a stop, larger in size than the inwardly extending wall portion; and
    a compression spring for urging the telescoped plunger and tubular member in opposite directions until the stops in the tubular member and on the plunger are in engagement.

2. A straight through electrical spring probe comprising:
    an elongated resilient thin wall tubular member having a longitudinal passage therethrough comprising a first linear bearing, the tubular member having a resilient and expandable first wall portion forming first and second substantially oppositely facing stops and, longitudinally spaced therefrom, a transversely retractable resilient second wall portion of larger outer perimeter than an adjacent portion of the wall;
    an elongated electrically conductive plunger member forming at one end a probe head and at the opposite end a connector portion, forming between the probe head and the connector portion a second linear bearing for sliding engagement with the first linear bearing and forming third and fourth substantially facing stops,
    the plunger member being insertable through the passage until the plunger and tubular member are in a telescoped condition wherein the probe head and connector portions are exposed at opposite ends of the tubular member, wherein the first and third stops are in substantially opposed relation and wherein the second and fourth stops are in substantially opposed relation, wherein during such insertion the fourth stop forces the first wall portion of the tubular member and the first and second stops to expand and, due to resiliency thereof, retract to such substantially opposed relations with the third and fourth stops; and
    a spiral compression spring for positioning around the plunger member and in the passage and having opposite ends for engagement with the first and third substantially opposed stops to thereby urge the plunger member and tubular member, when in a telescoped condition, in opposite directions until the second and fourth stops are in engagement.

3. A straight through electrical spring probe according to claim 2 wherein the wall of the tubular member has a longitudinally extending slit in the first wall portion.

4. A straight through electrical spring probe according to claim 2 wherein the wall of the tubular member has a longitudinally extending slit and forms a separation in the slit at the second wall portion.

5. A straight through electrical spring probe according to claim 2 wherein the wall of the tubular member comprises a longitudinal slit along the length thereof and the slit forms a separation at the second wall portion.

6. A straight through electrical spring probe according to claim 2 wherein the first wall portion comprises a portion of the tubular member having a smaller diameter than an adjacent portion of the tubular member and comprising the first and second stops.

7. A straight through electrical spring probe according to claim 2 wherein the plunger member comprises a cylindrical portion, extending between the third and fourth stops, of smaller outer diameter than the adjacent portions of the plunger member thereby forming the third and fourth stops.

8. A straight through electrical spring probe according to claim 2 wherein the second linear bearing comprises a first bearing portion of substantially a first diameter and a second bearing portion of substantially a second smaller diameter than the first diameter and wherein the first linear bearing comprises a first bearing portion for forming a substantially third diameter bearing and a second bearing portion for forming a substantially fourth diameter bearing, the fourth diameter being smaller than the third diameter, the first and third bearing portions and the second and fourth bearing portions being for sliding engagement.

9. A straight through electrical spring probe according to claim 2 wherein the second linear bearing comprises at least one cylindrical portion on the plunger member and the first linear bearing is substantially circular in cross-section for sliding engagement with the cylindrical portion.

10. A straight through electrical spring probe according to claim 9 wherein the wall is longitudinally tapered along at least a portion of the wall comprising said second wall portion.

11. A straight through electrical spring probe according to claim 9 wherein the wall comprises a ring shaped enlargement at said second wall portion.

12. A straight through probe according to claim 2 comprising a further stop on the plunger member and a still further stop on the tubular member for limiting the travel of the plunger member in the opposite direction from the urging of the spring.

13. A straight through probe according to claim 12 wherein the still further stop comprises an end of the tubular member.

14. A straight through electrical spring probe comprising:
an elongated resilient thin wall tubular member having a longitudinal passage therethrough, the tubular member having a resilient and expandable first wall portion forming first and second substantially oppositely facing stops and, longitudinally spaced therefrom, a transversely retractable resilient second wall portion of larger outer perimeter than an adjacent portion of the wall;
an elongated electrically conductive plunger member for telescoping with the tubular member and comprising at one end a probe head and at the opposite end a connector portion and between the probe head and connector portion third and fourth stops separated by a plunger member portion of smaller outer perimeter than the fourth stop, the fourth stop being of larger perimeter than the passage in the first wall portion,
the plunger member being insertable through the passage until the plunger and tubular member are in a telescoped condition wherein the probe head and connector portions are exposed at opposite ends of the tubular member, wherein the first and third stops are in a substantially opposed relation and wherein the second and fourth stops are in substantially opposed relation, wherein during such insertion the fourth stop forces the first wall portion of the tubular member to expand and, due to resiliency thereof, the first wall portion retracts around the plunger member portion of smaller perimeter; and
a spiral compression spring for positioning around the plunger member and in the passage and having opposite ends for engagement with the first and third substantially opposed stops to thereby urge the plunger member and tubular member, when in a telescoped condition, in opposite directions until the second and fourth stops are in engagement.

15. A straight through electrical spring probe according to claim 14 wherein the wall of the tubular member has a longitudinally extending slit at the first wall portion.

16. A straight through electrical spring probe according to claim 14 wherein the wall of the tubular member comprises a longitudinal slit along the length thereof and the slit forms a separation at the second wall portion.

17. A straight through electrical spring probe according to claim 14 wherein the first wall portion comprises a portion of the tubular member having a smaller diameter than an adjacent portion of the tubular member and comprising the first and second stops.

18. A straight through electrical spring probe according to claim 14 wherein the plunger member comprises a cylindrical portion, extending between the third and fourth stops, of smaller outer perimeter than the adjacent portions of the plunger member thereby forming the third and fourth stops.

19. A straight through electrical spring probe according to claim 14 wherein the wall of the tubular member has a longitudinally extending slit and forms a separation at the second wall portion.

20. A straight through electrical spring probe according to claim 19 wherein the wall is longitudinally tapered along at least a portion of the wall comprising said second wall portion.

21. A straight through electrical spring probe according to claim 19 wherein the wall comprises a ring shaped enlargement at the second wall portion.

22. A straight through electrical spring probe comprising:
a tapered elongated resilient thin wall tubular member having along the entire length thereof a slit in the wall and a passage therethrough, the tubular member having a resilient and expandable inwardly extending ring shaped wall portion forming first and second oppositely facing stops;
an elongated electrically conductive plunger member for telescoping with the tubular member and comprising at one end a probe head and at the opposite end a connector portion and between the probe head and the connector portion an inwardly extended portion forming third and fourth stops,
the plunger member being insertable through the passage until the plunger and tubular member are in a telescoped condition wherein the probe head and connector portions are exposed at opposite ends of the tubular member, wherein the first and third stops are in substantially opposed relation and wherein the second and fourth stops are in substantially opposed relation; and
a spiral compression spring for positioning around the plunger member and in the passage and having opposite ends for engagement with the first and third substantially opposed stops to thereby urge the plunger member and tubular member, when in a telescoped condition, in opposite directions until the second and fourth stops are in engagement.

23. A straight through electrical spring probe according to claim 22 wherein the slit has at least a portion with a separation therein.

24. A straight through electrical spring probe according to claim 22 wherein the fourth stop is enlarged with respect to the adjacent portions of the plunger member on each side thereof.

25. A method of forming a straight through electrical spring probe comprising the steps of:

forming an elongated resilient thin wall tubular member having a longitudinal passage therethrough, the tubular member having a resilient and expandable first wall portion forming first and second substantially oppositely facing stops and longitudinally spaced therefrom a transversely retractable resilient second wall portion of larger outer perimeter than an adjacent portion of the wall;

forming an elongated electrically conductive plunger member having at one end a probe head and adjacent the opposite end a connector portion and between the probe head and connector portion third and fourth stops separated by a plunger member portion of smaller outer perimeter than the fourth stop, the fourth stop being of larger perimeter than the passage in the first wall portion;

placing a spiral compression spring around the plunger member; and inserting the plunger member through the passage until the plunger and tubular member are in a telescoped condition wherein the probe head and connector portions are exposed at opposite ends of the tubular member and the third and first stops are in a substantially opposed relation and the second and fourth stops are in substantially opposed relation, the step of inserting including the step of utilizing the fourth stop to force the first wall portion of the tubular member to expand and, due to resiliency thereof, the first wall portion retracts around the plunger member portion of smaller perimeter;

upon insertion of the plunger member the spiral compression spring being positioned in the passage, opposite ends of the spiral compression spring engaging the first and third substantially opposed stops to thereby urge the plunger member and tubular member in opposite directions until the second and fourth stops are in engagement.

26. A method of forming a straight through electrical spring probe in a mounting member comprising the steps of:

forming an elongated resilient thin wall tubular member having a longitudinal passage therethrough, the tubular member having a resilient and expandable first wall portion forming first and second substantially oppositely facing stops and longitudinally spaced therefrom a tranversely retractable resilient second wall portion of larger outer perimeter than an adjacent portion of the wall;

forming an elongated electrically conductive plunger member having at one end a probe head and adjacent the opposite end a connector portion and between the probe head and connector portion third and fourth stops separated by a plunger member portion of smaller outer perimeter than the fourth stop, the fourth stop being of larger perimeter than the passage in the first wall portion;

placing a spiral compression spring around the plunger member;

inserting the plunger member through the passage until the plunger and tubular member are in a telescoped condition wherein the probe head and connector portions are exposed at opposite ends of the tubular member and the third and first stops are in a substantially opposed relation and the second and fourth stops are in substantially opposed relation, the step of inserting including the step of utilizing the fourth stop to force the first wall portion of the tubular member to expand and, due to resiliency thereof, the first wall portion retracts around the plunger member portion of smaller perimeter;

upon insertion of the plunger member the spiral compression spring being positioned in the passage, opposite ends of the spiral compression spring engaging the first and third substantially opposed stops to thereby urge the plunger member and tubular member in opposite directions until the second and fourth stops are in engagement; and subsequent to the foregoing steps inserting the tubular member into a mounting member having a passage therethrough with an outer perimeter smaller than the larger outer perimeter of the resilient second wall portion, causing the resilient second wall portion to retract, resiliency of the resilient second wall portion retaining the tubular member in the mounting member.

* * * * *